United States Patent
Hester

(10) Patent No.: US 10,200,053 B2
(45) Date of Patent: Feb. 5, 2019

(54) MAGNITUDE COMPENSATION TECHNIQUE FOR PROCESSING SINGLE-BIT WIDE DATA

(71) Applicant: Cirrus Logic International Semiconductor Ltd., Edinburgh (GB)

(72) Inventor: Dylan Alexander Hester, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 95 days.

(21) Appl. No.: 15/099,319

(22) Filed: Apr. 14, 2016

(65) Prior Publication Data
US 2017/0301360 A1    Oct. 19, 2017

(51) Int. Cl.
    H03M 1/06     (2006.01)
    G10L 19/00    (2013.01)
    H03H 17/02    (2006.01)
    H03M 1/66     (2006.01)

(52) U.S. Cl.
    CPC ...... H03M 1/0626 (2013.01); H03H 17/0219 (2013.01); H03M 1/66 (2013.01)

(58) Field of Classification Search
    CPC ....... G10L 19/00; G10L 19/005; G10L 19/02; G10L 19/167; G10L 19/26; H03M 1/66; G06F 17/17
    USPC ........... 704/500–504; 708/313; 341/144, 899
    See application file for complete search history.

(56) References Cited

U.S. PATENT DOCUMENTS

| 5,034,742 A * | 7/1991 | Bond ...................... H03M 7/42 341/106 |
| 5,751,615 A * | 5/1998 | Brown ............... H03H 17/0223 708/313 |
| 6,011,501 A * | 1/2000 | Gong .................... H03M 3/504 341/150 |
| 6,215,431 B1 * | 4/2001 | Sheng ................. H03M 1/0631 341/144 |
| 6,340,940 B1 | 1/2002 | Melanson |
| 6,727,832 B1 * | 4/2004 | Melanson ............. H03M 3/372 341/143 |

(Continued)

OTHER PUBLICATIONS

Mishra et al. "Efficient sharpening of CIC decimation filter." International Journal Engineering Science Adv Research, 2015. (3):52-56.*

(Continued)

Primary Examiner — Paras D Shah
(74) Attorney, Agent, or Firm — Norton Rose Fulbright US LLP

(57) ABSTRACT

Droop caused by a filter may be compensated by applying a pre-filter to the audio signal that cancels out, at least in part, the droop caused by the filter. The pre-filter may implement magnitude compensation that causes an approximately flat passband response when the pre-filtered signal is passed through the filter. The pre-filter may be applied to one-bit wide data streams, such as high-fidelity direct stream digital (DSD) audio data or other one-bit wide data such as pulse-density modulation (PDM) encoded data. The pre-filtering and filtering may be implemented in components of an audio processor, such as in a digital-to-analog converter (DAC). The pre-filtering may include upsampling the one-bit wide data to form symbols and substituting an eighth bit of the symbol with an inverted version of an earlier-received bit.

23 Claims, 5 Drawing Sheets

(56) References Cited

U.S. PATENT DOCUMENTS

| | | | | |
|---|---|---|---|---|
| 6,734,759 | B2* | 5/2004 | Humann | H04L 25/03878 333/167 |
| 7,031,395 | B2* | 4/2006 | Hinrichs | H04L 5/023 341/134 |
| 7,277,035 | B1* | 10/2007 | You | H03M 3/34 341/144 |
| 7,855,665 | B1* | 12/2010 | Chaichanavong | H03M 5/145 341/58 |
| 8,645,445 | B2* | 2/2014 | Bal | H03H 17/0286 708/304 |
| 2002/0052179 | A1* | 5/2002 | Hwang | H03H 7/0115 455/11.1 |
| 2004/0070528 | A1 | 4/2004 | Keehr et al. | |
| 2009/0264065 | A1* | 10/2009 | Song | H04B 7/155 455/8 |
| 2010/0235420 | A1* | 9/2010 | Willson, Jr. | H03H 17/0211 708/313 |
| 2016/0020779 | A1* | 1/2016 | Zhu | H03M 1/662 341/144 |

OTHER PUBLICATIONS

Kun, Qin, et al. "A multistage interpolation design of an audio DAC." Proceedings of the 2008 International Conference on Advanced Infocomm Technology. ACM, 2008.*

Jeong, Chanyong, Young-Jae Min, and Soo-Won Kim. "Double-sharpened decimation filter employing a pre-droop compensator for multistandard wireless applications." ETRI Journal 33.2 (2011): 169-175.*

Yang, Ken "Flatten DAC frequency response", Maxim Integrated Products, EDN, Apr. 13, 2006; May 13, 2006 (May 13, 2006), pp. 65-74.

* cited by examiner

MAGNITUDE COMPENSATION TECHNIQUE FOR PROCESSING SINGLE-BIT WIDE DATA

FIELD OF THE DISCLOSURE

The instant disclosure relates to signal processing. More specifically, portions of this disclosure relate to applying filters for processing of audio signals.

BACKGROUND

During processing of audio signals, such as conversion of digital signals to analog signals, the sounds contained in the audio signals can exhibit an error in frequency response. FIG. 1 is a graph showing the error in frequency response of audio data after application of a filter according to the prior art. A line 102 shows a frequency response of a filter, and a line 104 shows an ideal response for the same filter. The frequency response of line 102 deviates from the ideal line 104 over a large frequency range. However, deviations from ideal at frequencies outside of the human hearing range do not cause a large problem for a listener. A human hearing range is indicated as frequency range 106. Over the frequency range 106, the filter frequency response of line 102 droops from the ideal line 104 by an amount 108. This droop causes attenuation of high frequencies in the audio signal passed through the filter, and impacts the user's listening experience.

Shortcomings mentioned here are only representative and are included simply to highlight that a need exists for improved electrical components, particularly for audio processing components employed in consumer-level devices, such as mobile phones. Embodiments described herein address certain shortcomings but not necessarily each and every one described here or known in the art.

SUMMARY

Droop caused by a filter, as shown in FIG. 1, may be compensated by applying a pre-filter to the audio signal that cancels out, at least in part, the droop caused by the filter. The pre-filter may implement magnitude compensation that causes an approximately flat passband response when the pre-filtered signal is passed through the filter. The pre-filter may be applied to one-bit wide data streams, such as high-fidelity direct stream digital (DSD) audio data or other one-bit wide data such as pulse-density modulation (PDM) encoded data. The pre-filtering and filtering may be implemented in components of an audio processor, such as in a digital-to-analog converter (DAC).

In an embodiment of a digital-to-analog converter (DAC), the filter may be a finite impulse response (FIR) filter that converts the digital data to an analog signal that may be applied to a speaker or headphone to reproduce sounds contained in the one-bit wide audio data. In some embodiments, the FIR filter may be an analog FIR boxcar filter configured to perform part of the process of converting a digital signal to an analog waveform. In some embodiments, the FIR filter may include two banks of 256-tap analog FIR filters, in which each tap is a unit element current source. The two banks may be summed together to provide a net current representing the analog waveform. A current-to-voltage (I/V) converter, which may be a headphone amplifier, translates the net current into a voltage source, which represents an analog output for output to a headphone port.

A signal transfer function (STF) of a filter, such as the analog FIR in some embodiments, may have a comb SINC response with a first zero at 90 kHz, which creates magnitude response droop (e.g., passband droop) in the audio band similar to that shown in FIG. 1. One such filter, a 256-tap FIR, may have approximately 0.7 dB of droop at 20 kHz. By applying pre-filtering as described herein, this droop may be corrected to within +/−0.03 dB by a digital magnitude compensation pre-filter. In some embodiments, the pre-filter may operate on a multi-bit wide data, such as digital pulse-width modulation (PWM) symbols, corresponding to received single-bit wide data.

According to one embodiment, a method may include receiving one-bit wide input data; pre-filtering the one-bit input data to form pre-filtered data for filtering; and/or passing the pre-filtered data to a filter for the filtering, wherein the step of pre-filtering provides magnitude compensation such that filtered data has passband flatness in the audio band. Passband may refer to a range of frequencies of interest for a particular application. For example, for processing audio data, a range of frequencies of interest may be 20 Hz-20 kHz, which is the approximate range of human hearing. Thus, passband flatness may refer to approximately flat response between 20 Hz-20 kHz. However, in other applications, the frequencies of interest may be different. Further, even within audio applications, the frequencies of interest may be smaller, such as if only a low frequencies channel is being processed by audio processing circuitry or if audio is being processed for output to a transducer with limited reproduction range.

In certain embodiments, the step of pre-filtering may include substituting a bit of the one-bit input data with an inverted version of an earlier received bit in the received one-bit input data, in which the bit being substituted is selected from the received one-bit input data to obtain a desired magnitude response; the step of receiving the one-bit input data may include receiving one-bit input data upsampled by repeating the one-bit through eight time slots to form a multi-bit symbol, and the step of substituting the bit of the one-bit input data may include substituting the inverted version of the earlier received bit into an eighth time slot of the repeated eight time slots of the one-bit input data; the step of passing the pre-filtered data to a filter may include passing the pre-filtered data to a boxcar finite impulse response (FIR) filter constrained to processing one-bit data; the FIR filter may be constrained to positive coefficients; and/or the step of receiving one-bit input data may include receiving direct stream digital (DSD) audio data or pulse-density modulation (PDM) audio data.

According to a further embodiment, an audio processor or other circuitry, such as may be part of a digital-to-analog converter (DAC) may be configured to perform steps including receiving one-bit wide input data; pre-filtering the one-bit input data to form pre-filtered data for filtering; and/or passing the pre-filtered data to a filter for the filtering, wherein the step of pre-filtering provides magnitude compensation such that filtered data has passband flatness in the audio band. In one embodiment, the audio processor is a digital-to-analog converter (DAC) configured to convert the received DSD or PDM audio data into an analog signal for output to a transducer to playback a high-fidelity music audio file.

In certain embodiments, the audio processor may be configured to perform the step of pre-filtering by substituting a bit of the one-bit input data with an inverted version of an earlier received bit in the received one-bit input data, in which the bit being substituted is selected from the received one-bit input data to obtain a desired magnitude response; the step of receiving the one-bit input data by receiving one-bit input data upsampled by repeating the one-bit through eight time slots to form a multi-bit symbol, and the step of substituting the bit of the one-bit input data by substituting the inverted version of the earlier received bit into an eighth time slot of the repeated eight time slots of the one-bit input data; the step of passing the pre-filtered data to a filter by passing the pre-filtered data to a boxcar finite impulse response (FIR) filter constrained to processing one-bit data; the FIR filter may be constrained to positive coefficients; and/or the step of receiving one-bit input data by receiving direct stream digital (DSD) audio data or pulse-density modulation (PDM) audio data.

According to another embodiment, an apparatus may include a digital-to-analog converter (DAC) having an input node configured to receive a digital one-bit data stream; an output node configured to output an analog signal corresponding to the received one-bit data stream; an analog finite impulse response (FIR) filter having a magnitude response droop in a range of frequencies, wherein the analog finite impulse response (FIR) filter is configured to process the received one-bit data stream to generate the analog signal for the output node; and/or a pre-filtering circuit coupled to the analog finite impulse response (FIR) filter and coupled to the input node and configured to provide magnitude compensation for the magnitude response droop of the analog finite impulse response (FIR) filter by pre-filtering the received digital one-bit data stream before processing by the analog finite impulse response (FIR) filter.

In certain embodiments, the pre-filtering circuit may be configured to substitute a bit of the received one-bit data stream with an inverted version of an earlier received bit in the received one-bit data stream, in which the bit being substituted is selected from the received one-bit input data to obtain a desired magnitude response; the digital one-bit data stream may include symbols each comprised of eight time slots, and the pre-filtering circuit may be configured to substitute a bit of an eighth time slot of a symbol with the inverted version of an earlier received bit in the received one-bit data stream; the analog finite impulse response (FIR) filter may include a boxcar filter configured to be constrained to processing one-bit data; the filter may be confined to all positive coefficients; and/or the received digital one-bit data stream may include direct stream digital (DSD) audio data or pulse-density modulation (PDM) audio data.

In some embodiments, the apparatus may also include an amplifier coupled to the output node of the digital-to-analog converter (DAC) and configured to drive a transducer to output sounds corresponding to the received one-bit wide data, such as DSD audio data; and/or the apparatus may include a current-to-voltage converter coupled to the analog finite impulse response (FIR) filter, wherein the current-to-voltage converter is configured to generate an output analog voltage signal at the output node based on an output of the finite impulse response (FIR) filter.

According to another embodiment, a method may include sampling an input signal at a sampling frequency to obtain a plurality of samples, wherein the input signal is a signal having a base frequency lower than the sampling frequency such that the plurality of samples comprise data from the input signal repeated multiple times proportional to a ratio of the sampling frequency to the base frequency, and wherein the plurality of samples comprise symbols having a number of bits proportional to the ratio; pre-filtering the plurality of samples by applying a magnitude compensation filter having coefficient weights mapped to bits within the symbols; and/or filtering the pre-filtered plurality of samples to convert the plurality of samples to an analog signal, wherein the pre-filtering provides magnitude compensation such that the filtered, pre-filtered plurality of samples has passband flatness.

In certain embodiments, the step of pre-filtering may include substituting a bit of a first symbol with an inverted version of a bit of an earlier symbol; the step of pre-filtering may include selecting the bit of the first symbol for substitution to obtain a desirable magnitude response; the step of upsampling may obtain symbols having eight repeated bits, and the step of pre-filtering comprises substituting an eighth bit of the first symbol with an inverted version of a bit of the earlier symbol; the input signal may include digital data, and the filtering may perform conversion of the digital data to the analog signal; and/or the digital data may include direct stream digital (DSD) audio data, and the method further includes driving a transducer with the analog signal to reproduce sounds encoded in the direct stream digital (DSD) audio data.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
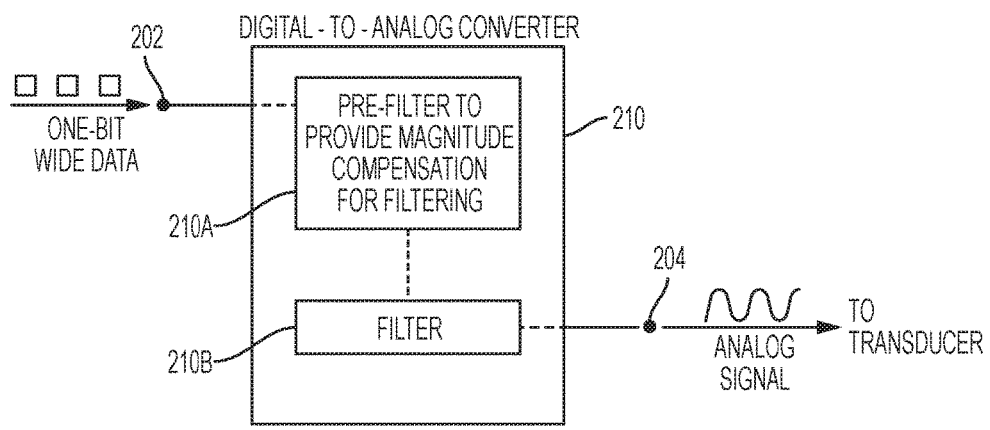
FIG. 2 is a block diagram illustrating an example of audio processing with pre-filtering to provide magnitude compensation for a filter according to one embodiment of the disclosure.

FIG. 2 is a block diagram illustrating an example of audio processing with pre-filtering to provide magnitude compensation for a filter according to one embodiment of the disclosure. An audio processor, such as a digital-to-analog converter (DAC) 210, may have an input node 202 configured to receive one-bit wide data. The received signal at input node 202 may represent audio data, such as data formatted as direct stream digital (DSD) data or pulse-density modulated (PDM) data. A pre-filter 210A of the DAC 210 may receive data from the input node 202. The pre-filter may process the data to provide magnitude compensation for audio frequency response error introduced by filtering performed by filter 210B. When the pre-filtered data is processed by the filter, droop and/or other distortions that are an unintended effect of the filter 210B may be reduced or eliminated because the pre-filtered signal was compensated such that the combined audio frequency response errors would cancel out. An output of the filter 210B may be coupled to an output node 204. An analog signal may be driven to the output node 204 by the DAC 210 corresponding to information contained in the one-bit wide data received at input node 202. The analog signal output at output node 204 may have approximately a passband flatness, such that little to no audio frequency response error is added to the one-bit wide data in the analog signal output.

Figure 3:
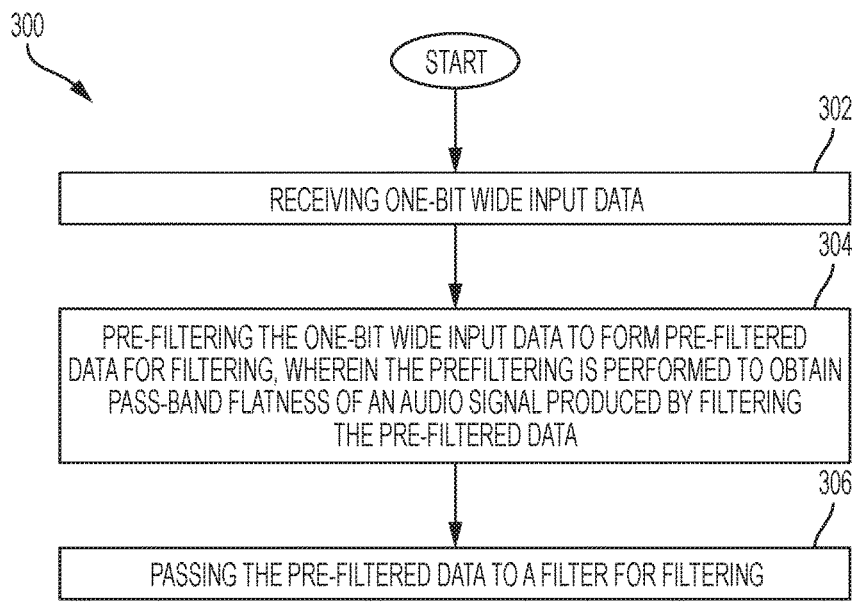
FIG. 3 is a flow chart illustrating an example method for pre-filtering one-bit wide data to provide magnitude compensation for a filter according to one embodiment of the disclosure.

One method for processing data in a digital-to-analog converter (DAC) or other audio processor is described in FIG. 3. FIG. 3 is a flow chart illustrating an example method for pre-filtering one-bit wide data to provide magnitude compensation for a filter according to one embodiment of the disclosure. A method 300 may include, at block 302, receiving one-bit wide input data. Then, at block 304, the one-bit wide input data is pre-filtered to form pre-filtered data. The pre-filtering may be performed in such a manner to obtain passband flatness of an audio signal produced when the pre-filtered data is filtered and converted to an analog signal. Next, at block 306, the pre-filtered data may be passed to a filter for filtering, such as conversion to an analog signal by an analog finite impulse response (FIR) filter.

Figure 1:
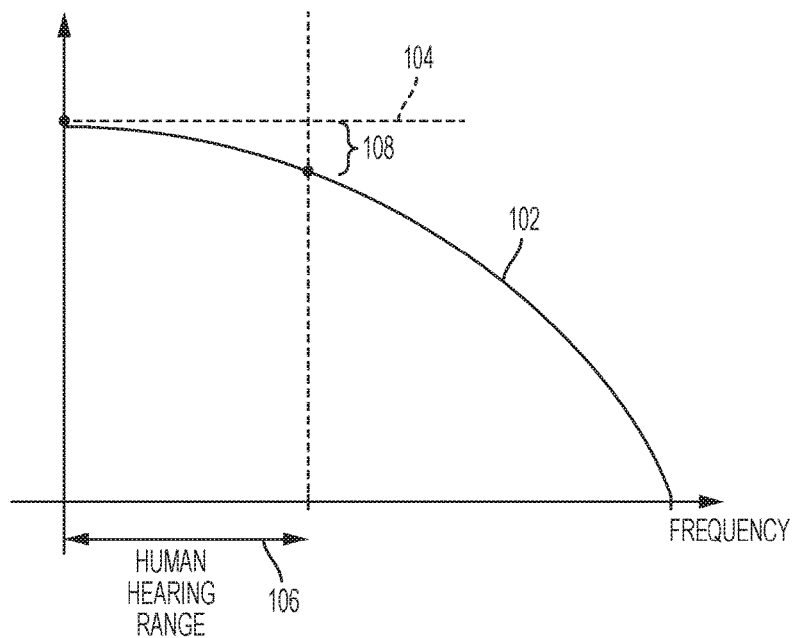
FIG. 1 is a graph showing magnitude response droop of audio data after application of a filter according to the prior art.
Figure 4:
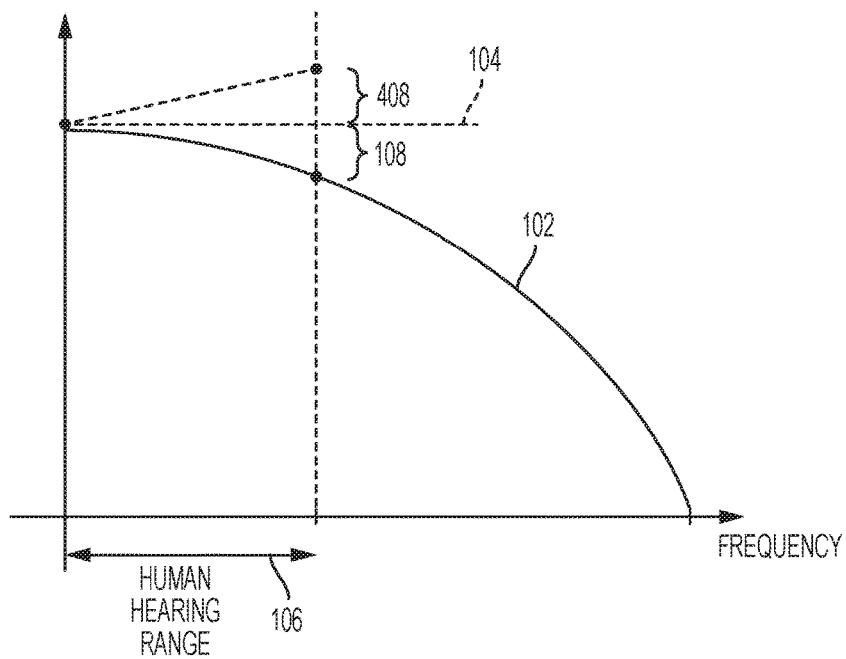
FIG. 4 is a graph showing correction of audio magnitude response droop using pre-filter to provide magnitude compensation for a filter according to one embodiment of the disclosure.

An example of one possible result of pre-filtering is shown in FIG. 4. FIG. 4 is a graph showing correction of audio frequency response error using pre-filter to provide magnitude compensation for a filter according to one embodiment of the disclosure. The graph of FIG. 4 is similar to the graph of FIG. 1. The line 102 shows a frequency response of a filter, including droop 108 within the human hearing range 106. Pre-filtering may be performed to modify data in a received one-bit wide data stream to obtain approximately the pre-filtered line 408. When the data of pre-filtered line 408 is passed through the filter with the frequency response of line 102, the resulting signal may be an approximately ideal response of line 104, because the magnitude compensation applied during pre-filtering cancels out the droop 108.

Figure 5:
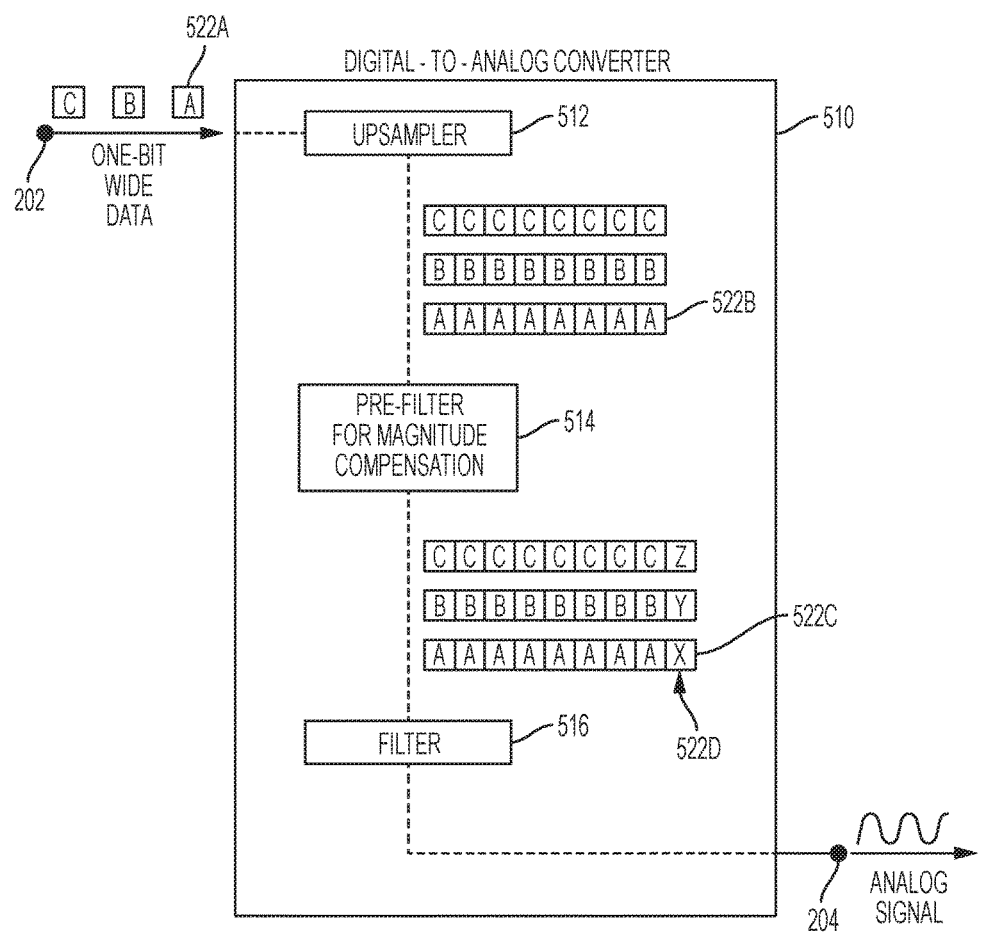
FIG. 5 is a block diagram illustrating an example of audio processing with pre-filtering by upsampling and substituting bits to provide magnitude compensation for a filter according to one embodiment of the disclosure.

In one embodiment, pre-filtering may be applied by upsampling and/or substituting bits in the upsampled data, as shown in FIG. 5. FIG. 5 is a block diagram illustrating an example of audio processing with pre-filtering by upsampling and substituting bits to provide magnitude compensation for a filter according to one embodiment of the disclosure. A digital-to-analog converter (DAC) 510 may have an input node 202 configured to receive one-bit wide data, such as one-bit wide data 522A. The DAC 510 may output an analog signal at output node 204 that contains sounds corresponding to information contained in the received digital data at the input node 202. The analog signal at output node 204 may have an approximate passband flatness as a result of the pre-filter 514 compensating for droop caused by the filter 516.

The DAC 510 may convert the digital data received at input node 202 to an analog signal output at output node 204. A filter 516 may perform the digital to analog conversion. In one embodiment, the filter 516 may be a FIR filter, such as a boxcar finite impulse response (FIR) filter constrained to processing one-bit data and/or constrained to outputting all positive coefficients. A pre-filter 514 may be coupled to the filter and apply processing to the received digital data at input node 202. The pre-filter 514 may, for example, provide magnitude compensation to compensate for droop or other audio frequency response error caused by the filter 516, or other signal processing functionality that may be coupled between the pre-filter 514 and the output node 204.

The DAC 510 may also include an upsampler 512 coupled between the input node 202 and the pre-filter 514. The upsampler 512 may increase a sample rate of the one-bit wide data received at the input node 202. In some embodiments, the upsampler 512 may convert the one-bit wide data into a multi-bit wide data symbol through the upsampling operation. For example, the input one-bit wide data signal may be a signal having a base frequency lower than the sampling frequency of the upsampler 512, such that the upsampled data comprises data from the input signal repeated multiple times proportional to a ratio of the sampling frequency to the base frequency. The upsampled samples may comprise symbols having a number of bits proportional to the ratio of the sampling frequency to the base frequency. In some embodiments, the upsampler may upsample the one-bit wide data received at input node 202 into 8-bit symbols by sampling the input node 202 at a rate eight times higher than the base frequency of the input signal at the input node 202. The multi-bit symbols may include redundant information that can be used as part of the signal processing.

Using this redundant information as available time slots in the symbol, a signal transfer function (STF) of a digital magnitude compensation FIR may be approximated by realizing that the analog FIR can perform a similar magnitude compensation function as a digital FIR. This can be done by mapping the coefficient weights of a digital FIR $H1(z)$ function into the time slots, or bits, of the multi-bit symbols formed by upsampler 512. One example of the $H1(z)$ function is given by:

$$H1(z) = 1 - \tfrac{1}{8} * z^{-23}$$

A filter implementing the $H1(z)$ signal transfer function may provide adequate audio band magnitude compensation for a comb SINC filter, such as an analog FIR filter implemented as filter 516. The following filter, $H2(z)$, may possess nearly the same passband response as $H1(z)$:

$$H2(z) = \tfrac{7}{8} - \tfrac{1}{8} * z^{-21}$$

In the transfer function $H2(z)$, the first input sample may be represented by the first 7 time slots of the symbol and the second input sample may be represented by the eighth time slot. The pre-filter 514 may apply magnitude compensation by replacing the eighth bit of the symbol with an inverted version of an earlier bit. The earlier bit may be selected from the input data to obtain a desired magnitude compensation. In one embodiment, the pre-filter 514 may substitute an eighth bit of the symbol with a data sample that has been inverted and delayed by 21 one-bit symbols of the input data at input node 202. If the H2(z) function is upsampled from 64*Fs to 512*Fs to match the sample rate of a filter 516, such as an analog FIR, the H2(z) function may be rewritten as:

$$H2mc(z)=\tfrac{1}{8}*(7-z^{\wedge}(-21*8))$$

The signal transfer function (STF) for a single one-bit symbol interval of eight time slots of an analog FIR, such as may be used as filter 516, can be written by:

$$H\text{symbol}(z)=\tfrac{1}{8}*(1+z^{\wedge}-1+z^{\wedge}-2+z^{\wedge}-3+z^{\wedge}-4+z^{\wedge}-5+z^{\wedge}-6+z^{\wedge}-7)$$

This filter may operate at 512*Fs, which is the same rate as H2mc(z) above. H2mc(z) can be rewritten as:

$$H2mc(z)=\tfrac{1}{8}*(7A+B),$$

where A is a first one-bit input sample and B is a second, delayed one-bit input sample.

H2mc(z) may map to the eight time slots of the one-bit symbol interval by substituting H2mc(z) into Hsymbol(z) as follows:

$$Hmc\text{sym}(z)=\tfrac{1}{8}*(A+A*z^{\wedge}-1+A*z^{\wedge}-2+A*z^{\wedge}-3+A*z^{\wedge}-4+A*z^{\wedge}-5+A*z^{\wedge}-6+B*z^{\wedge}-7),$$

which is an oversampled transfer function.

In terms of performance, the uncorrected 20-20 kHz passband response of an analog FIR used as filter 516 may be approximately +0, −0.7 dB. Using the magnitude compensation technique through a pre-filter as described in embodiments above, the corrected 20-20 kHz passband response of the analog FIR may be approximately +0, −0.03 dB.

Figure 6:
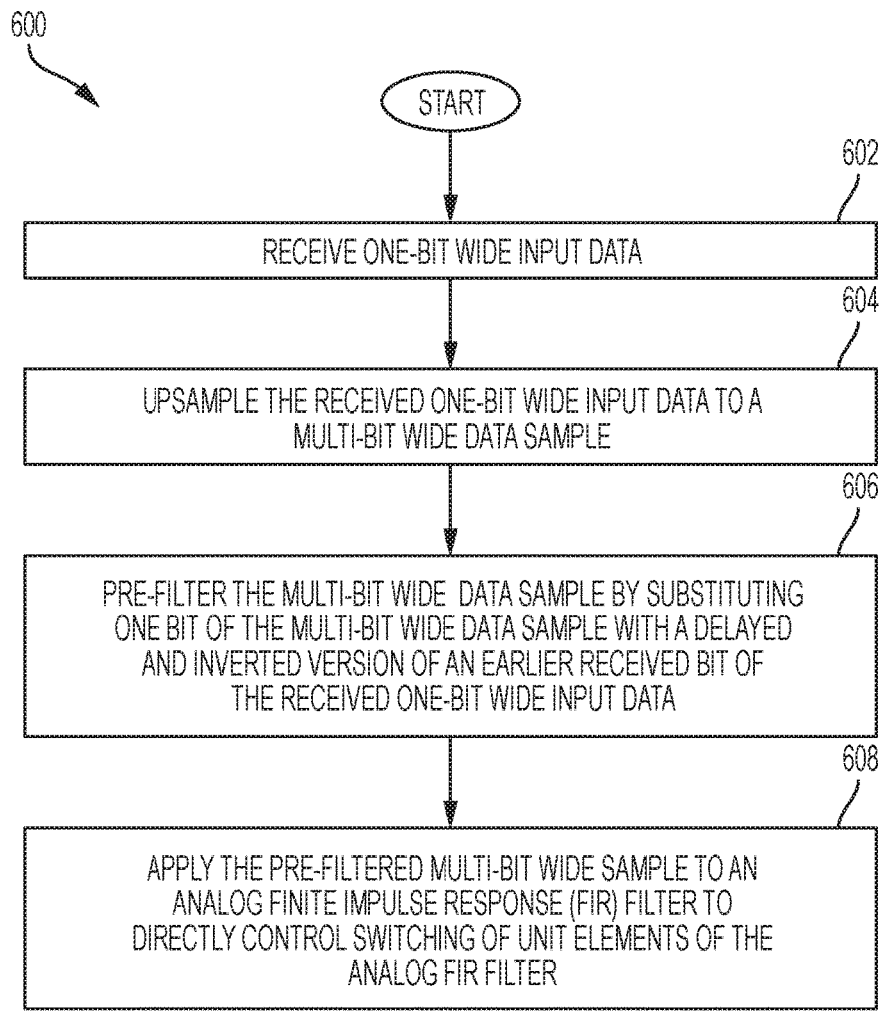
FIG. 6 is a flow chart illustrating an example method for pre-filtering one-bit wide data by upsampling and substituting bits to provide magnitude compensation for a filter according to one embodiment of the disclosure.

A method of processing data, such as in a digital-to-analog converter (DAC), to pre-filter one-bit wide data by upsampling and substituting bits is shown in FIG. 6. FIG. 6 is a flow chart illustrating an example method for pre-filtering one-bit wide data by upsampling and substituting bits to provide magnitude compensation for a filter according to one embodiment of the disclosure. A method 600 may begin at block 602 with receiving one-bit wide input data. For example, data 522A may be received at input node 202 of FIG. 5. The method 600 may continue to block 604 with upsampling the received one-bit wide input data to a multi-bit wide data symbol. For example, the one-bit wide data 522A may be upsampled to multi-bit wide data symbol 522B. The multi-bit wide data may include repeated samples of the one-bit wide data. The multi-bit wide data symbol 522B may include two or more copies of the one-bit wide data 522A, although examples using eight-bit wide data symbols are described herein.

Next, at block 606, the multi-bit wide data symbol is pre-filtered to provide magnitude compensation to compensate for audio frequency response error introduced by a filter. The magnitude compensation may be provided by substituting one bit of the upsampled multi-bit wide data with an inverted version of an earlier received bit of the received one-bit wide input data. For example, when data 522B is passed through the pre-filter 514 of FIG. 5, a bit 522D may be replaced to form pre-filtered multi-bit wide data sample 522C. In one embodiment, the bit 522D may be replaced with a value X that is an inverted version of an earlier received bit, such as a bit received 21 samples earlier at the input node 202. The pre-filter 514 may be programmed to variably select earlier bits or programmed to select a fixed bit, such as a 7th bit, 14th bit, 21st bit, or 28th bit. The pre-filtered samples 522C may be passed, at block 608, to an analog finite impulse response (FIR) filter. In one embodiment, the pre-filtered samples 522C may directly control switching of unit elements of the analog FIR filter. When the pre-filtered samples 522C are passed through the filter, audio frequency response error introduced by the filter may be reduced or eliminated.

Figure 7:
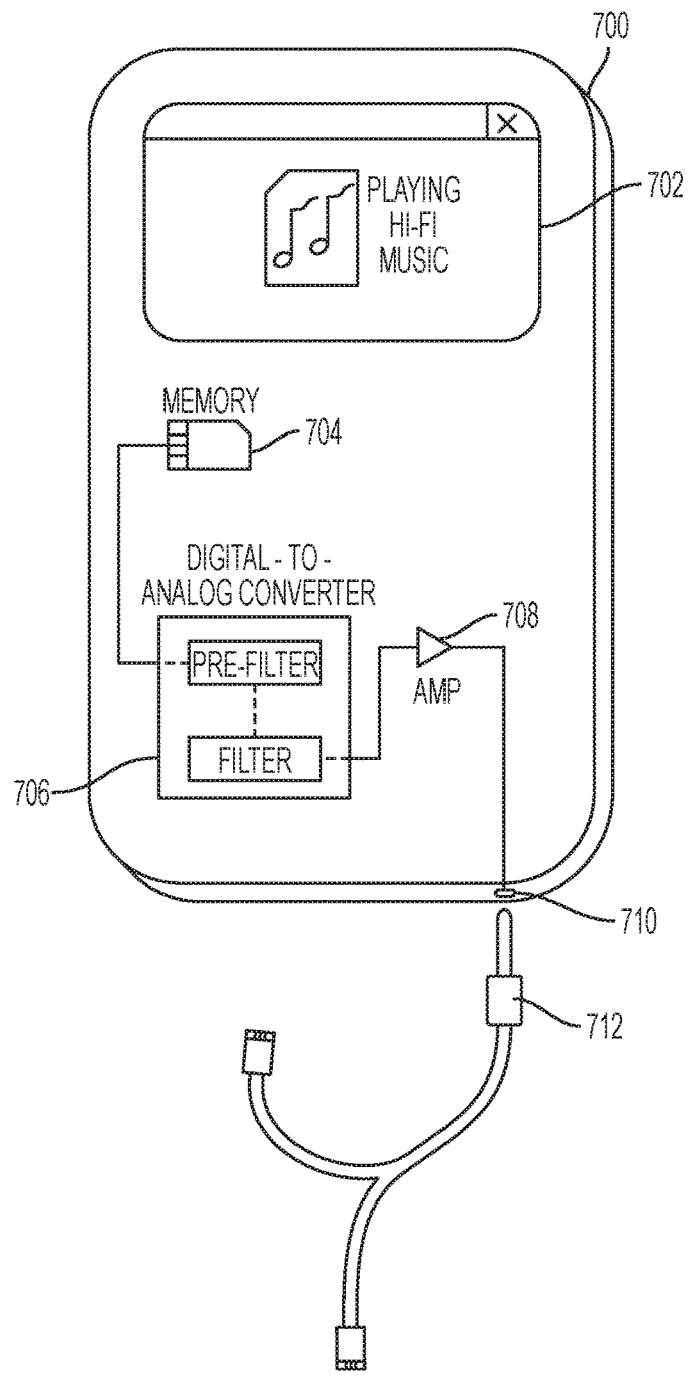
FIG. 7 is an illustration showing an example personal media device for playback of high-fidelity audio including an audio component that is configured to perform pre-filtering to provide magnitude compensation for a filter according to one embodiment of the disclosure.

One advantageous embodiment for an audio processor with pre-filtering, such as a digital-to-analog converter (DAC), is a personal media device for playing back high-fidelity music from one-bit wide digital data, such as DSD or PDM data. FIG. 7 is an illustration showing an example personal media device for playback of high-fidelity audio including an audio component that is configured to perform pre-filtering to provide magnitude compensation for a filter according to one embodiment of the disclosure. A personal media device 700 may include a display 702 for allowing a user to select from music files for playback, which may include both high-fidelity music files and normal music files. When high-fidelity music files are selected by a user, DSD audio files may be retrieved from memory 704 by an application processor (not shown) and provided to a digital-to-analog converter (DAC) 706. The DAC 706 may include a pre-filter and filter, similar to those described in the embodiments of FIG. 2 or FIG. 5 and/or may perform methods similar to those described in the embodiments of FIG. 3 and FIG. 6. The digital data retrieved from memory 704 may be converted to analog signals by the DAC 706, and those analog signals amplified by an amplifier 708. The amplifier 708 may be coupled to an audio output 710, such as a headphone jack, for driving a transducer, such as headphones 712. Although the data received at the DAC 706 is described as being received from memory 704, the one-bit wide data may also be received from other sources, such as a USB connection, a device connected through Wi-Fi to the personal media device 700, a cellular radio, another wireless radio, and/or another wired connection.

The schematic flow chart diagrams of FIG. 3 and FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer.

By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components. As another example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   receiving, by an audio processor, one-bit wide input data;
   pre-filtering, by the audio processor, the one-bit input data to form pre-filtered data for filtering, wherein the step of pre-filtering comprises substituting a first bit of the one-bit input data with an inverted version of a second bit received earlier than the first bit in the received one-bit input data; and
   passing, by the audio processor, the pre-filtered data to a filter for the filtering, wherein the step of pre-filtering provides magnitude compensation such that filtered data has passband flatness, wherein the one-bit input data comprises digital data, and wherein the filtering performs conversion of the digital data to an analog signal.

2. The method of claim 1, wherein the bit being substituted is selected from the received one-bit input data to obtain a desired magnitude response.

3. The method of claim 1, wherein the step of receiving the one-bit input data comprises receiving one-bit input data upsampled by repeating the one-bit through eight time slots, and wherein the step of substituting the bit of the one-bit input data comprises substituting the inverted version of the earlier received bit into an eighth time slot of the repeated eight time slots of the one-bit input data.

4. The method of claim 1, wherein the step of passing the pre-filtered data to a filter comprises passing the pre-filtered data to a boxcar finite impulse response (FIR) filter of the audio processor, wherein the FIR filter is constrained to processing one-bit data.

5. The method of claim 1, wherein the step of receiving one-bit input data comprises receiving direct stream digital (DSD) or pulse density modulated (PDM) audio data.

6. An apparatus, comprising:
   a digital-to-analog converter (DAC), comprising:
      an input node configured to receive a digital one-bit data stream;
      an output node configured to output an analog signal corresponding to the received one-bit data stream;
      an analog finite impulse response (FIR) filter having a magnitude response droop in a range of frequencies, wherein the analog finite impulse response (FIR) filter is configured to process the received one-bit data stream to generate the analog signal for the output node; and
      a pre-filtering circuit coupled to the analog finite impulse response (FIR) filter and coupled to the input node and configured to provide magnitude compensation for the magnitude response droop of the analog finite impulse response (FIR) filter by pre-filtering the received digital one-bit data stream before processing by the analog finite impulse response (FIR) filter, wherein the pre-filtering circuit is configured to substitute a first bit of the received one-bit data stream with an inverted version of a second bit, received earlier than the first bit in the received one-bit data stream.

7. The apparatus of claim 6, wherein the bit being substituted is selected from the received one-bit input data to obtain a desired magnitude response.

8. The apparatus of claim 6, wherein the digital one-bit data stream comprises symbols of eight time slots, and wherein the pre-filtering circuit is configured to substitute a bit of an eighth time slot of a symbol with the inverted version of an earlier received bit in the received one-bit data stream.

9. The apparatus of claim 6, wherein the analog finite impulse response (FIR) filter comprises a boxcar filter configured to be constrained to processing one-bit data.

10. The apparatus of claim 6, further comprising a current-to-voltage converter coupled to the analog finite impulse response (FIR) filter, wherein the current-to-voltage converter is configured generate an output analog voltage signal at the output node based on an output of the finite impulse response (FIR) filter.

11. The apparatus of claim 6, wherein the received digital one-bit data stream comprises direct stream digital (DSD) audio data, and wherein the apparatus further comprises an amplifier coupled to the output node of the digital-to-analog converter (DAC) and configured to drive a transducer to output sounds corresponding to the direct stream digital (DSD) audio data.

12. A method, comprising:
   sampling an input signal at a sampling frequency to obtain a plurality of samples, wherein the input signal is a signal having a base frequency lower than the sampling frequency such that the plurality of samples comprise data from the input signal repeated multiple times proportional to a ratio of the sampling frequency to the base frequency, and wherein the plurality of samples comprises symbols having a number of bits proportional to the ratio;

pre-filtering the plurality of samples by applying a magnitude compensation filter having coefficient weights mapped to bits within the symbols; and filtering the pre-filtered plurality of samples to convert the plurality of samples to an analog signal, wherein the pre-filtering provides magnitude compensation such that the filtered pre-filtered plurality of samples has passband flatness wherein the input signal comprises digital data, and wherein the filtering performs conversion of the digital data to the analog signal.

13. The method of claim 12, wherein the step of pre-filtering comprises substituting a bit of a first symbol with an inverted version of a bit of an earlier symbol.

14. The method of claim 13, wherein the step of pre-filtering comprises selecting the bit of the first symbol for substitution to obtain a desirable magnitude response.

15. The method of claim 13, wherein the step of sampling obtains symbols having eight repeated bits, and wherein the step of pre-filtering comprises substituting an eighth bit of the first symbol with an inverted version of a bit of the earlier symbol.

16. The method of claim 12, wherein the digital data comprises direct stream digital (DSD) audio data, and wherein the method further comprises driving a transducer with the analog signal to reproduce sounds encoded in the direct stream digital (DSD) audio data.

17. An apparatus, comprising:
an audio processor, wherein the audio processor is configured to perform steps comprising:
receiving, by the audio processor, an input signal comprising one-bit wide input data;
sampling the input signal at a sampling frequency to obtain a plurality of samples, wherein the input signal is a signal having a base frequency lower than the sampling frequency such that the plurality of samples comprise data from the input signal repeated multiple times proportional to a ratio of the sampling frequency to the base frequency, and wherein the plurality of samples comprise symbols having a number of bits proportional to the ratio;

pre-filtering, by the audio processor, the one-bit input data to form pre-filtered data for filtering, wherein the step of pre-filtering provides magnitude compensation such that filtered data has passband flatness; and passing, by the audio processor, the pre-filtered data to a filter for the filtering, wherein the one-bit wide input data comprises digital data, and wherein the filtering performs conversion of the digital data to an analog signal.

18. The apparatus of claim 17, wherein the audio processor is configured to perform pre-filtering by substituting a bit of the one-bit input data with an inverted version of an earlier received bit in the received one-bit input data.

19. The apparatus of claim 18, wherein the audio processor is configured to substitute a bit selected from the received one-bit input data to obtain a desired magnitude response.

20. The apparatus of claim 18, wherein the audio processor is configured to upsample the received one-bit input data by repeating the one-bit through eight time slots, and wherein the audio processor is configured to perform substituting the bit of the one-bit input data by substituting the inverted version of the earlier received bit into an eighth time slot of the repeated eight time slots of the one-bit input data.

21. The apparatus of claim 17, wherein the audio processor is configured to perform passing the pre-filtered data to a filter by passing the pre-filtered data to a boxcar finite impulse response (FIR) filter of the audio processor, wherein the FIR filter is constrained to processing one-bit data.

22. The apparatus of claim 17, wherein the audio processor is configured to receive direct stream digital (DSD) or pulse density modulated (PDM) audio data.

23. The apparatus of claim 22, wherein the audio processor is a digital-to-analog converter (DAC) configured to convert the received DSD or PDF audio data into an analog signal for output to a transducer to playback a high-fidelity music audio file.

* * * * *